(12) United States Patent
Thyagarajan et al.

(10) Patent No.: US 7,940,546 B2
(45) Date of Patent: May 10, 2011

(54) ROM ARRAY

(75) Inventors: Sriram Thyagarajan, Austin, TX (US); Gus Yeung, Austin, TX (US); Andrew John Sowden, Whittlesford (GB)

(73) Assignee: ARM Limited, Cambridge (GB)

( * ) Notice: Subject to any disclaimer, the term of this patent is extended or adjusted under 35 U.S.C. 154(b) by 282 days.

(21) Appl. No.: 12/320,667

(22) Filed: Jan. 30, 2009

(65) Prior Publication Data

US 2010/0195365 A1    Aug. 5, 2010

(51) Int. Cl.
*G11C 17/00* (2006.01)

(52) U.S. Cl. .......... 365/104; 365/185.2; 365/185.25; 365/185.16; 365/189.02

(58) Field of Classification Search .......... 365/104, 365/185.2, 185.25, 185.16, 189.02
See application file for complete search history.

(56) References Cited

U.S. PATENT DOCUMENTS

| | | | | |
|---|---|---|---|---|
| 5,677,867 A | * | 10/1997 | Hazani | 365/185.01 |
| 5,784,327 A | * | 7/1998 | Hazani | 365/189.03 |
| 7,405,985 B2 | * | 7/2008 | Cernea et al. | 365/200 |
| 2004/0136228 A1 | * | 7/2004 | Campardo et al. | 365/150 |
| 2007/0242511 A1 | * | 10/2007 | Chen et al. | 365/185.02 |

* cited by examiner

*Primary Examiner* — Tuan T. Nguyen
(74) *Attorney, Agent, or Firm* — Nixon & Vanderhye P.C.

(57) ABSTRACT

A ROM array is provided, comprising a plurality of columns of memory cells, wherein each column of memory cells is coupled to a shared bit line which is shared by that column of memory cells and an adjacent column of memory cells. Each column of memory cells has its own associated reference line, which is selectively coupled to a reference potential. Each reference line is coupled to the reference potential when a read operation is performed on a memory cell of the associated column of memory cells. Each reference line is decoupled from the reference potential when a read operation is performed on a memory cell of the adjacent column of memory cells. Both reference lines associated, via their columns of memory cells, to a shared bit line are decoupled from the reference potential when the shared bit line is being precharged prior to the read operation. The present invention thus provides a ROM array in which both leakage reduction and speed increase benefits result, whilst providing a high density design.

13 Claims, 6 Drawing Sheets

ROM ARRAY

BACKGROUND OF THE INVENTION

1. Field of the Invention

The present invention relates to ROM arrays.

2. Description of the Prior Art

ROM arrays composed of columns and rows of memory cells are known in the art. When a data value is required to be read out from such a ROM array, first the row of memory cells containing the memory cell holding the required data value is selected by activating a word line corresponding to that row. Then a bit line associated with the column of memory cells containing the memory cell holding the required data value is used to perform a read operation on the value stored in the selected memory cell. Typically this read operation is carried out by pre-charging the selected bit line and then measuring the discharge that occurs when the relevant memory cell is activated by means of its corresponding word line.

Various techniques have been proposed to achieve high density ROM arrays. In U.S. Pat. No. 5,917,224 a compact ROM matrix is disclosed in which two adjacent columns of memory cells share a virtual ground line. In U.S. Pat. No. 7,002,827 a ROM array is disclosed in which a column of memory cells shares a virtual ground line with an adjacent column of memory cells on one side and shares a bit line with an adjacent column of memory cells on the other side. The densities of memory cells achieved by these two prior art arrangements are not however without associated cost.

For example, in the arrangement of U.S. Pat. No. 5,917,224 the coupling capacitance between the adjacent bit lines can be problematically high, especially for bit lines which have a large number of transistors connected thereto. On the other hand the arrangement of U.S. Pat. No. 7,002,827 requires more complex readout logic, to ensure that the generated data value has been read from the memory cell intended to be read and not another memory cell sharing a bit line or virtual ground line. In both cases the increase in capacitance of the shared virtual ground lines (with respect to non-shared virtual ground lines) can lead to delays in operational speed.

It would be desirable to provide an improved technique for providing high density ROM arrays.

SUMMARY OF THE INVENTION

Viewed from a first aspect, the present invention provides a ROM array comprising: a plurality of columns of memory cells; each column of memory cells being coupled to a shared bit line, said shared bit line being shared by that column of memory cells with an adjacent column of memory cells; each column of memory cells being connected to its own associated reference line; and each reference line having associated switch circuitry arranged to selectively couple that reference line to a reference potential, wherein said associated switch circuitry of each reference line couples that reference line to said reference potential when a read operation is performed on a memory cell of the associated column of memory cells, said associated switch circuitry of each reference line decouples that reference line from said reference potential when a read operation is performed on a memory cell of said adjacent column of memory cells, and the associated switch circuitry of each reference line associated with the columns of memory cells connected to the shared bit line decouples those reference lines from said reference potential when the shared bit line is being pre-charged prior to said read operation.

The inventors of the present invention found that an advantageous degree of ROM array density improvement could be achieved by providing plural columns of memory cells, wherein each column of memory cells is coupled to a shared bit line, the shared bit line being shared by one column of memory cells with an adjacent column of memory cells. Advantageously only a relatively simple arrangement of readout circuitry is then found to be necessary if those columns of memory cells is connected to its own associated reference line. Furthermore, it has been found that sharing reference lines between columns of memory cells provides a rather limited space saving benefit and this minor advantage is often outweighed by the high capacitive load of a shared reference line, which may significantly slow down the switching speed of that line.

Furthermore, by associating switch circuitry with each reference line, wherein that switch circuitry is arranged to selectively couple that reference line to a reference potential, at least two advantages result.

Firstly, the pre-charging of each (shared) bit line can take place earlier in the read cycle, since by decoupling from the reference potential both of the reference lines associated with the two columns of memory cells that share a bit line, that bit line can be pre-charged without significant leakage occurring in those memory cells. Hence, the bit line may be pre-charged prior to the read cycle commencing. Without being able to decouple the reference lines from the reference potential, pre-charging the bit line prior to the read cycle in this manner would lead to significant leakage across the memory cells. Thus, according to the techniques of the present invention, not only is leakage reduced, but reading speed is also increased because the bit line is already pre-charged at the start of the read cycle and a delay whilst pre-charging the bit line during the read cycle is avoided. This pre-charging delay can consume around 25% of the cycle.

Secondly, a read operation can take place with respect to a first column of memory cells coupled to a shared bit line, without influence from a second column of memory cells coupled to that same bit line, by coupling the reference line of the first column of memory cells to the reference potential, but not the reference line of the second column of memory cells.

In one embodiment, connection of each reference line to said reference potential by said associated switch circuitry is determined by an associated column selection signal, wherein the column selection signal for a first column of memory cells and the column selection signal for a second column of memory cells cannot be simultaneously asserted if said first column of memory cells shares a bit line with said second column of memory cells. Hence the control over which reference line of which column of memory cells is connected to the reference potential is determined by means of a column selection signal for each column of memory cells. By specifying that the column selection signal for two columns of memory cells cannot be simultaneously asserted if those columns share a bit line, the sharing of that bit line is enabled, without conflict between the two columns of memory cells occurring.

In one embodiment, each reference line has further associated switch circuitry arranged to selectively couple that reference line to an alternative potential different to said reference potential, each reference line being connected to said alternative potential by said further associated switch circuitry when that reference line is not connected to said reference potential. By connecting each reference line to the alternative potential when that reference line is not connected to the reference potential, and hence when the corresponding column of memory cells is not being read, the opportunity for that reference line to float at an unknown voltage level is avoided, which could otherwise lead to charge sharing across the column of memory cells that is not being read, and hence read errors on the shared bit line. In this embodiment it may be arranged that the further associated switch circuitry couples its associated reference line to said alternative potential when said column selection signal is not asserted. Hence the column selection signal provides the determination both for when to connect each reference line to the reference potential and also (anti-correlated thereto) when to connect each reference line to the alternative potential.

It will be appreciated that the reference potential could in principle take a range of arbitrary values, but in one embodiment said reference line is a virtual ground line and said reference potential is a ground voltage level. This provides a convenient reference potential within the context of other associated circuitry.

Similarly, in the case where each reference line has further associated switch circuitry arranged to selectively couple that reference line to an alternative potential different to said reference potential, it will be appreciated that the alternative potential could in principle take a range of arbitrary values, but in one embodiment said reference line is a virtual ground line, said reference potential is a ground voltage level and said alternative potential is a supply voltage level. This provides a convenient alternative potential within the context of other associated circuitry.

In one embodiment, at least one column of said plurality of columns of memory cells is a dummy column for self-timing of the read operation. Self-timing of the read operation is a convenient method of reliably timing the read operation and a dummy column of memory cells, arranged for the purpose of providing timing information, provides a useful source of this information at the minor cost of a column of memory cells in which regular data is not stored. According to this embodiment, it may be arranged that said dummy column generates a dummy read signal for said self-timing of the read operation. This dummy read signal may then be conveniently passed to whichever locations in the ROM array it is required for self-timing purposes.

In one embodiment, pre-charging said shared bit line comprises connecting said shared bit line to a pre-charging potential dependent on a pre-charge signal. The pre-charge signal may be readily provided by standard control circuitry, and connection of the shared bit line to that pre-charging potential is then dependent on that signal.

In one embodiment a data value readout from said shared bit line is stored in a latch circuit. By storing the data value in a latch circuit, that data value is then temporarily saved, and the shared bit line is then freed up to be pre-charged ready for a subsequent read. The data value stored in the latch circuit can then be read out when needed. In this embodiment it may be arranged that a plurality of shared bit lines share said latch circuit, each of said plurality of shared bit lines being coupled to said latch circuit by shared bit line switch circuitry in dependence on a shared bit line selection signal. Space and power saving advantages may be derived from the arrangement of multiple shared bit lines being coupled to one latch circuit, and the selection of which shared bit line should be connected at any given time to the latch circuit is conveniently provided by a shared bit line selection signal.

Viewed from a second aspect, the present invention provides a ROM array comprising: a plurality of columns of memory cells; each column of memory cells for coupling to a shared bit line, said shared bit line being shared by that column of memory cells with an adjacent column of memory cells; each column of memory cells being connected to its own associated reference line; and each reference line having associated switch means for selectively coupling that reference line to a reference potential, wherein said associated switch means of each reference line couples that reference line to said reference potential when a read operation is performed on a memory cell of the associated column of memory cells, said associated switch means of each reference line decouples that reference line from said reference potential when a read operation is performed on a memory cell of said adjacent column of memory cells, and the associated switch means of each reference line associated with the columns of memory cells connected to the shared bit line decouples those reference lines from said reference potential when the shared bit line is being pre-charged prior to said read operation.

Viewed from a third aspect, the present invention provides a method of operating a ROM array, said ROM array comprising: a plurality of columns of memory cells; each column of memory cells being coupled to a shared bit line, said shared bit line being shared by that column of memory cells with an adjacent column of memory cells; and each column of memory cells being connected to its own associated reference line, said method comprising the steps of: selecting a memory cell to read in a selected column of memory cells; decoupling the reference line associated with the selected column of memory cells from the reference potential and decoupling the reference line associated with the adjacent column of memory cells from the reference potential; pre-charging the shared bit line; coupling the reference line associated with the selected column of memory cells to the reference potential; and performing a read operation on the selected memory cell.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
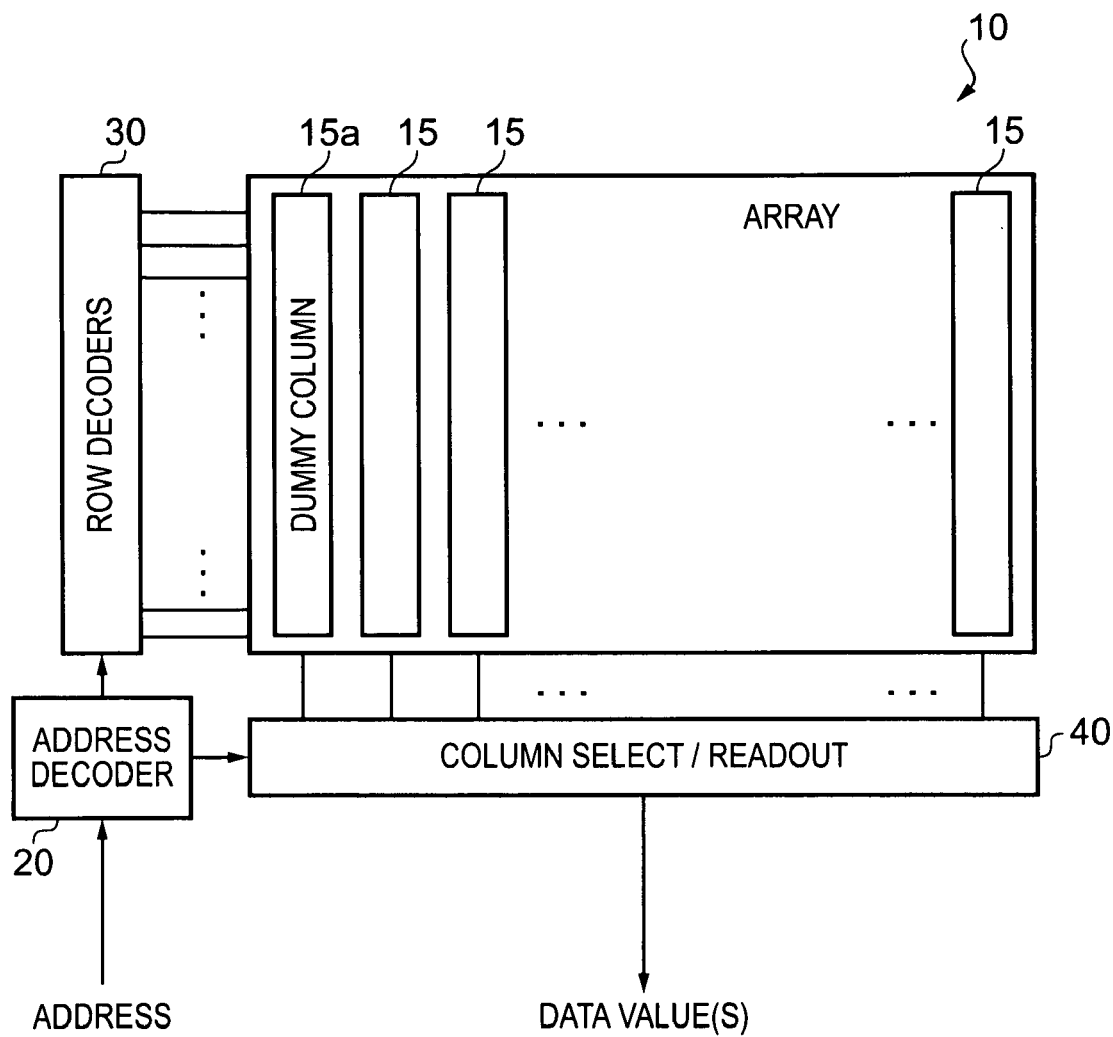
FIG. 1 schematically illustrates a ROM array according to one embodiment of the present invention.

FIG. 1 schematically illustrates a ROM array according to one embodiment of the present invention. ROM array 10 comprises columns of memory cells 15 arranged in an array. Data stored in the memory cells of the ROM array is accessed by means of an address received by address decoder 20. Address decoder 20 passes control signals to row decoders 30 and column select/readout circuitry 40. A data value stored in a particular memory cell at the intersection of a given row and column is then read out, the data value being passed via column select/readout circuitry 40. The columns of memory cells 15 include a dummy column 1 5A which is not used to store data values for reading out, but rather to produce timing information for self-timing a read operation on one of the other columns.

Figure 2:
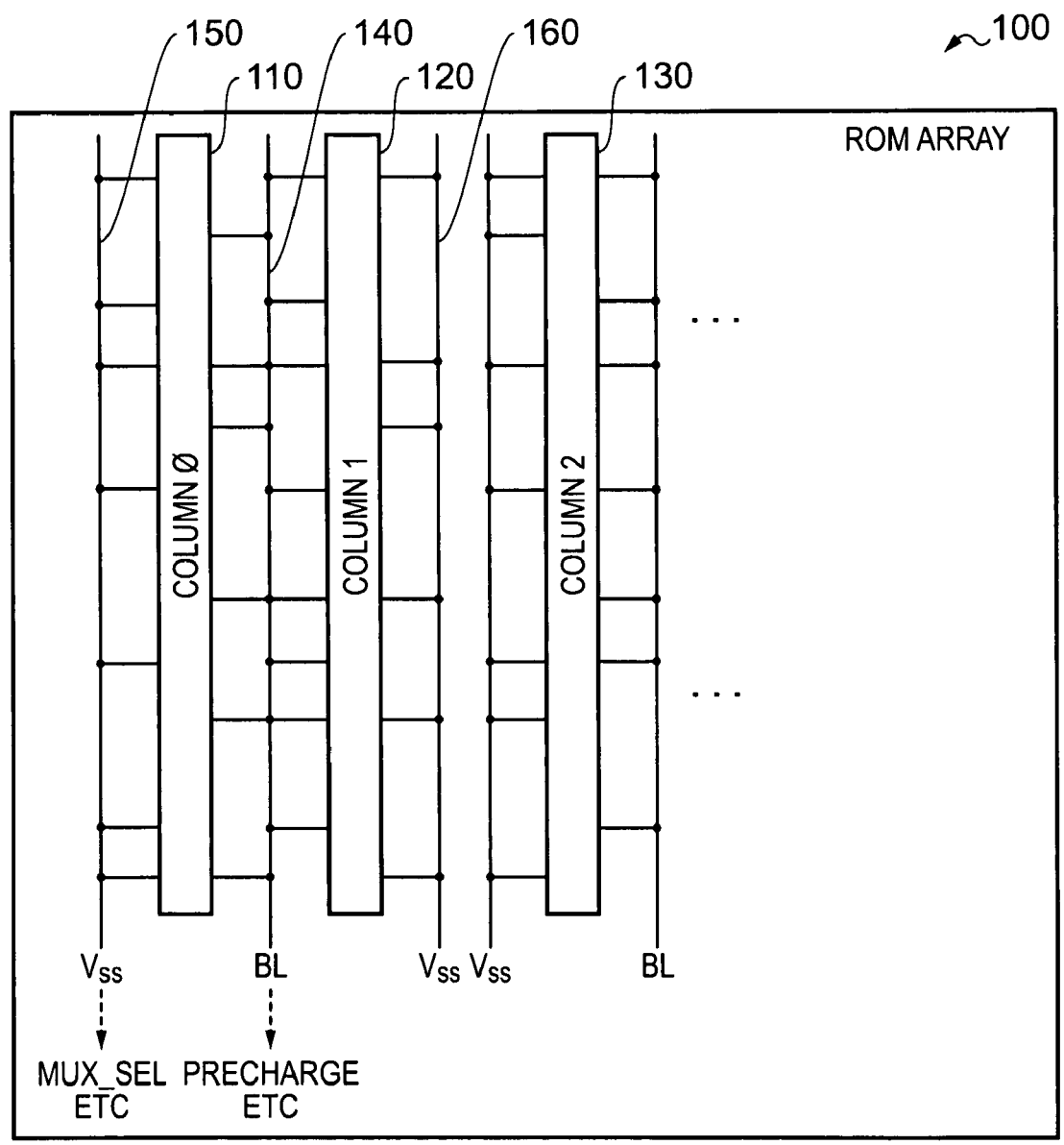
FIG. 2 schematically illustrates a ROM array according to one embodiment of the present invention.

Further detail of a ROM array according to one embodiment of the present invention is schematically illustrated in FIG. 2. As in FIG. 1, the ROM array 100 comprises a plurality of columns of memory cells, of which only three columns (110, 120 and 130) are illustrated for clarity. As can be seen in FIG. 2, each column of memory cells has its own dedicated virtual ground line ($V_{SS}$), but shares a bit line (BL) with an adjacent column of memory cells. For example, column 110 and column 120 share bit line 140, but have their own associated virtual ground lines 150 and 160 respectively. Note that the illustrated connections of the columns of memory cells to the virtual ground lines and bit lines will in reality depend on the particular logical value ("0" or "1") stored in each memory cell of that column, and hence the illustrated connections between each column and its virtual ground line and bit line are for illustrative purposes only. Connected to each virtual ground line and bit line are selection and readout circuitry components which will be described in more detail with reference to the following figures.

Figure 3:
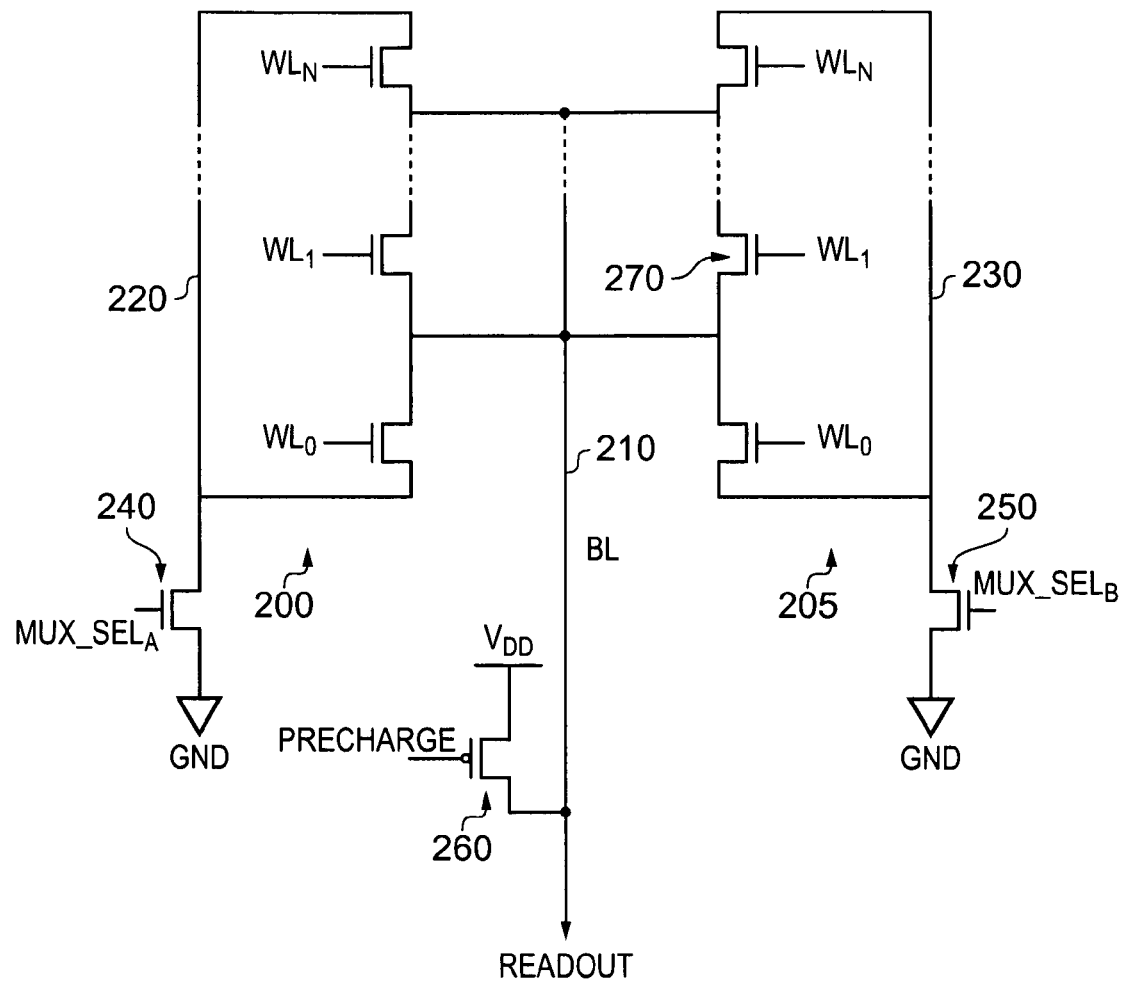
FIG. 3 schematically illustrates two columns of memory cells having a shared bit line according to one embodiment of the present invention.

FIG. 3 schematically illustrates two adjacent columns of memory cells 200 and 205 according to one embodiment of the present invention. The columns of memory cells 200 and 205 share bit line (BL) 210, but have their own virtual ground lines 220 and 230 respectively. Each column of memory cells comprises many individual memory cells, of which only three are illustrated for clarity. The virtual ground lines 220 and 230 are selectively connectable to virtual ground by means of column selection switches 240 and 250 respectively. The state of column selection switch 240 is determined by the column selection signal $MUX\_SEL_A$. The state of column selection switch 250 is determined by column selection signal $MUX\_SEL_B$. The memory cells are selected in rows by means of word lines $WL_0$ to $WL_N$. The bit line 210 is pre-charged in dependence on the signal PRECHARGE which causes pre-charge switch 260 to couple the bit line 210 to $V_{DD}$.

The reading of a data value stored in a memory cell of FIG. 3 is carried out as follows. Taking the example that the data value stored in memory cell 270 is desired to be readout, previously first both $MUX\_SEL_A$ and $MUX\_SEL_B$ decouple virtual ground lines 220 and 230 from virtual ground (i.e. the signals $MUX\_SEL_A$ and $MUX\_SEL_B$ are not asserted) and then the signal PRECHARGE is asserted by setting the signal PRECHARGE to a low level (since pre-charge switch 260 is a PMOS transistor connecting to $V_{DD}$), causing bit line 210 to become pre-charged. This pre-charging can take place without significant leakage occurring, because of the existence of two transistors (a memory cell and a column selection switch) in series between the bit line and virtual ground. Then, at the beginning of a read cycle, the signal PRECHARGE is de-asserted (this signal going high) and shortly thereafter word line $WL_1$ and column selection signal $MUX\_SEL_B$ are asserted. Then, depending on the data value stored in memory cell 270 (i.e. the particular connections of this NMOS transistor to bit line 210 and virtual ground line 230) the pre-charge on bit line 210 will either discharge through memory cell 270 and virtual ground line 230 or will hold relatively constant. This discharge is measured by circuitry connected at the readout (label READOUT) as will be described in more detail hereafter.

Figure 4:
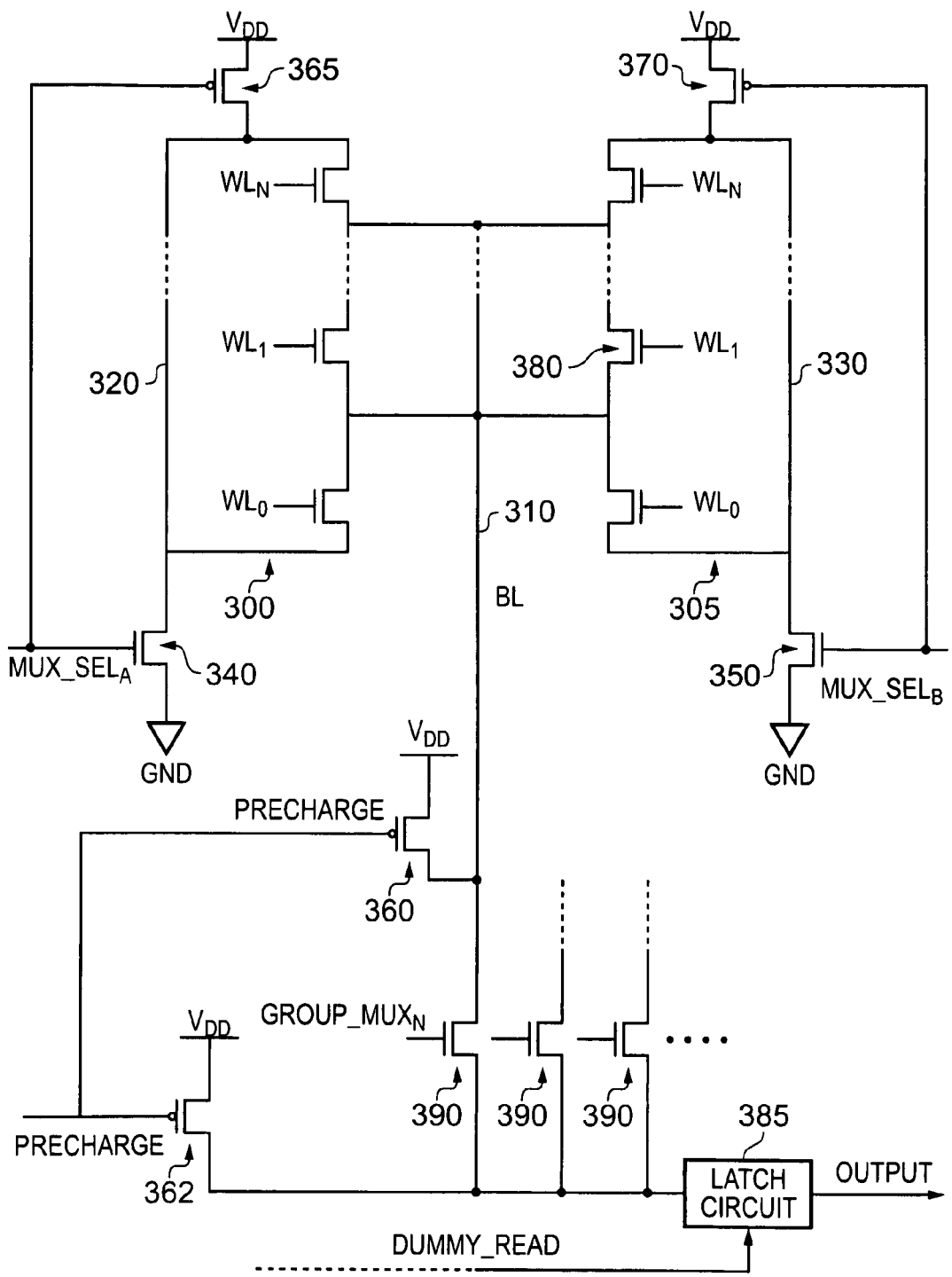
FIG. 4 schematically illustrates two columns of memory cells having a shared bit line according to one embodiment of the present invention.

FIG. 4 schematically illustrates two columns of memory cells according to one embodiment of the present invention. Here the two columns of memory cells 300 and 305 are equivalent to the columns of memory cells 200 and 205 described with reference to FIG. 3. Similarly, virtual ground lines 320 and 330 are equivalent to virtual ground lines 220 and 230 in FIG. 3. Also, column selection switches 340 and 350 are equivalent to column selection switches 240 and 250 in FIG. 3, also being governed by the column selection signals $MUX\_SEL_A$ and $MUX\_SEL_B$. Finally pre-charge switch 360 is equivalent to pre-charge switch 260 in FIG. 3. Note however that in this embodiment a further pre-charge switch 362 is provided to ensure that the bit line is properly pre-charged on both sides of shared bit line switch 390, as is further discussed below.

In the embodiment in FIG. 4 however the virtual ground lines 320 and 330 each have a further switch associated therewith selectively coupling those virtual ground lines to $V_{DD}$. These PMOS transistors 365 and 370 are also governed by the column selection signals $MUX\_SEL_A$ and $MUX\_SEL_B$. However, being PMOS transistors rather than NMOS transistors like transistors 340 and 350, the switching of switches 365 and 370 is anti-correlated with the switching of switches 340 and 350. Thus when $MUX\_SEL_A$ is asserted virtual ground line 320 is connected to ground and when $MUX\_SEL_A$ is not asserted virtual ground line 320 is connected to $V_{DD}$. Similarly, $MUX\_SEL_B$ mutually exclusively connects virtual ground line 330 to virtual ground or to $V_{DD}$. This connection of each virtual ground line to $V_{DD}$ when the corresponding column selection signal is not asserted ensures that the virtual ground lines cannot float, which could lead to charge sharing across the corresponding column of memory cells.

A readout operation in the embodiment illustrated in FIG. 4 works as described with reference to the embodiment illustrated in FIG. 3, i.e. the reading of memory cell 380 is effected by pre-charging bit line 310 before asserting word line $WL_1$ and column selection signal $MUX\_SEL_B$. The data value read out of memory cell 380 is latched in latch circuit 385. This latching is performed in dependence upon the signal received from a dummy column of memory cells, DUMMY_READ. The dummy column of memory cells is arranged such that all memory cells in that column store a logical value of one. This then means that whichever word line is asserted the corresponding memory cell of the dummy column of memory cells will discharge its bit line providing a timing reference according to which it can be decided whether or not a memory cell in another column of memory cells has a one or a zero stored there. Note that the signal DUMMY_READ is generated by further circuitry (not illustrated) to convert the bit line discharge into a useful timing signal. The two columns of memory cells 300 and 305 connected via bit line 310 to latch circuit 385 are only one pair of columns of memory cells connected to latch circuit 385. Which shared bit line is connected to latch circuit 385 at any time is determined by shared bit line switches 390, which are switched in dependence on the set of signals $GROUP\_MUX_N$. Additional pre-charge switch 362 ensures that the portion of each bit line between the shared bit line switch and the latch circuit is also properly pre-charged.

Figure 5:
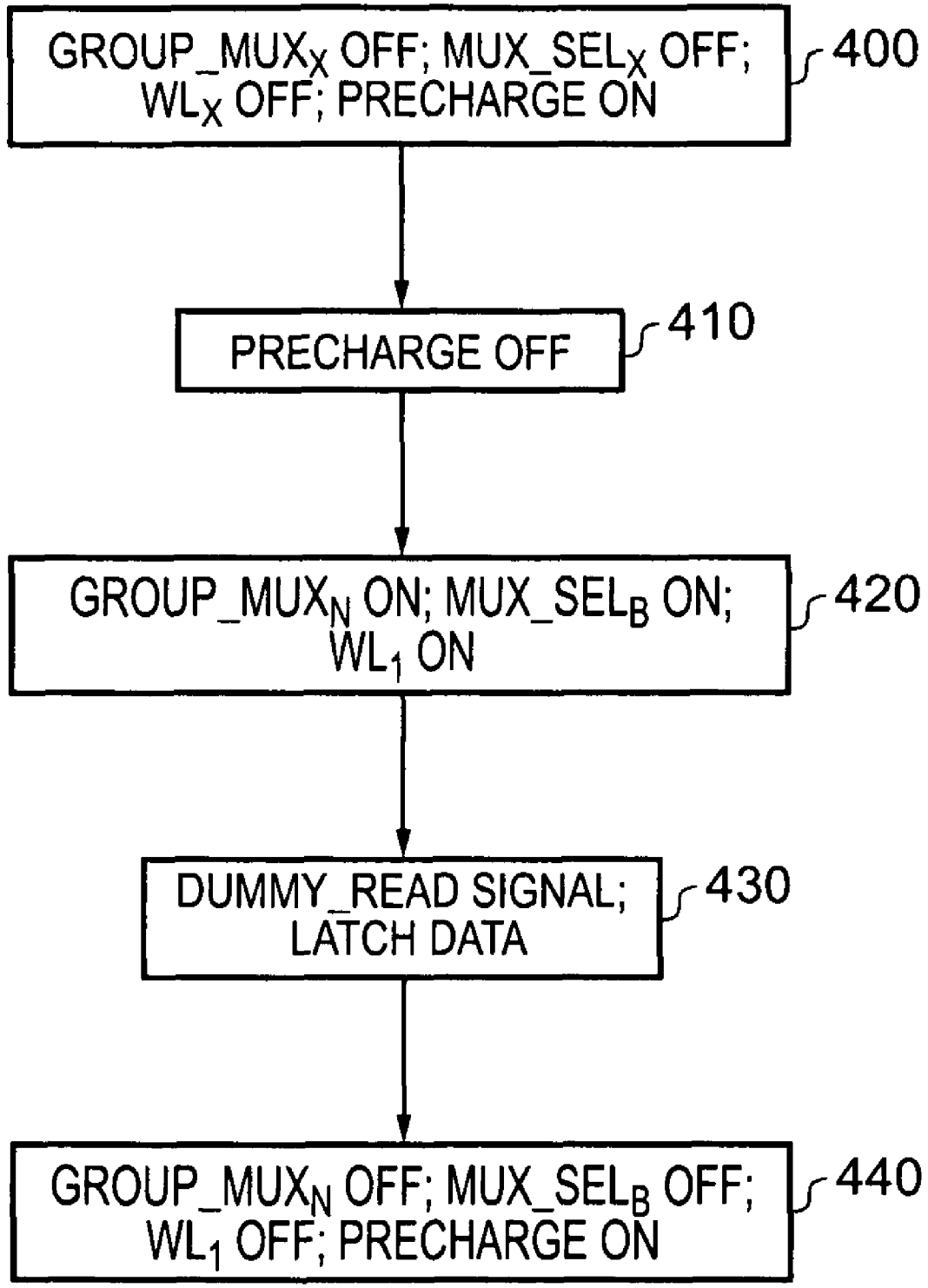
FIG. 5 schematically illustrates a series of steps taken according to one embodiment of the present invention.

FIG. 5 is a flow diagram illustrating the set of steps taken in one embodiment in a read cycle for a given memory cell (in this example memory cell 380 in FIG. 4). Initially at step 400 all GROUP_MUX signals, all MUX_SEL and all word line signals WL are off. The signal PRECHARGE is on (i.e. set low) to pre-charge the bit line. Then at step 410 the signal PRECHARGE is switched off (i.e. the signal goes high). At step 420 the shared bit line selection signal corresponding to the relevant shared bit line $GROUP\_MUX_N$, $MUX\_SEL_B$ and the word line signal $WL_1$ are all switched on. Shortly thereafter at step 430 the dummy read signal indicates the self-timing of the read operation and the data value is latched into the latch circuit. Finally at step 440 the signals $GROUP\_MUX_N$, $MUX\_SEL_B$ and $WL_1$ are all switched off and pre-charge is re-asserted to pre-charge the bit line once again.

Figure 6:
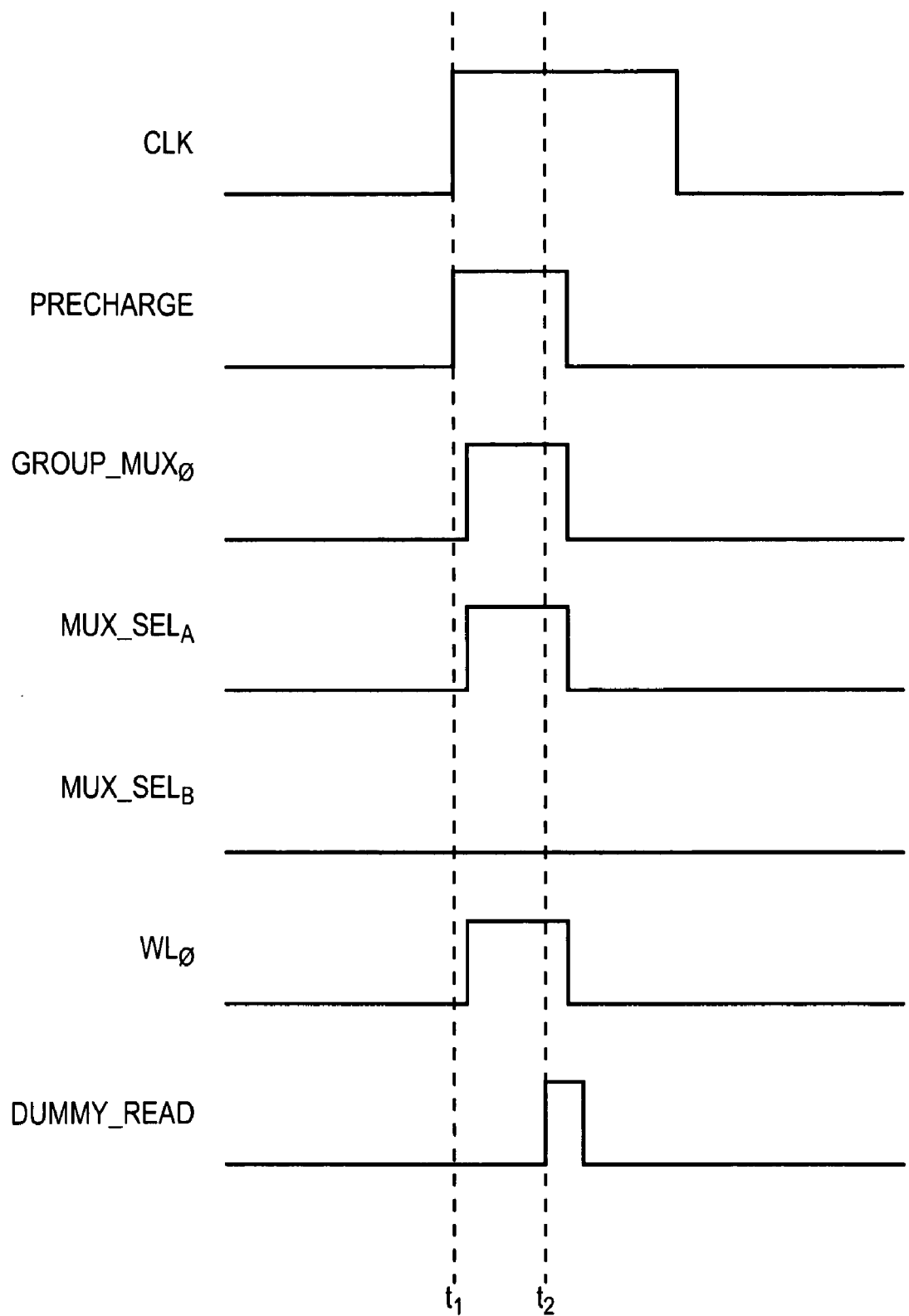
FIG. 6 schematically illustrates relative timings of various signals in a ROM array according to one embodiment of the present invention.

FIG. 6 schematically illustrates the relative timing of various signals in one embodiment. Initially in the latter part of a clock cycle (i.e. when CLK is low) the pre-charge signal PRECHARGE is also low, thus pre-charging the bit line. All other signals illustrated in FIG. 6 are also low at this time. Thus, the bit line is left in a pre-charged state, prior to the read cycle. As explained above the combination of two transistors (memory cell and column selection switch) in series means that holding the bit line in this pre-charged state is possible without significant leakage. Then at time $t_1$, on the rising clock edge, the signal PRECHARGE is de-asserted (i.e. PRECHARGE goes high). This rising clock edge signals that the read operation may begin and shortly thereafter (this short delay being determined by the gates propagating this signal) the shared bit line selection signal $GROUP\_MUX_0$, the column selection signal $MUX\_SEL_A$ and the word line $WL_0$ are asserted (NB in this example a different memory cell to that read out in the example of FIG. 5 is being accessed). Then at time $t_2$ when the DUMMY_READ signal goes high (resulting from circuitry that converts the dummy column's discharge into a useful timing signal format) this indicates that the data value on the bit line can be latched. Shortly thereafter $GROUP\_MUX_0$, $MUX\_SEL_A$ and $WL_0$ are switched off and the pre-charge signal is re-asserted. Having switched off these signals DUMMY_READ shortly thereafter goes low.

As described above, the techniques of the present invention thus provide a ROM array in which both leakage reduction and speed increase benefits result, whilst providing a high density design. Since the shared bit line is pre-charged prior to the read cycle, the delay in waiting for the bit line to pre-charge as a first step- at the start of a read cycle is avoided. By decoupling from virtual ground both virtual ground lines associated with the two columns of memory cells that share a bit line, that bit line can be pre-charged without significant leakage occurring in those memory cells.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

We claim:
1. A ROM array comprising:
a plurality of columns of memory cells;
each column of memory cells being coupled to a shared bit line, said shared bit line being shared by that column of memory cells with an adjacent column of memory cells;
each column of memory cells being connected to its own associated reference line; and
each reference line having associated switch circuitry arranged to selectively couple that reference line to a reference potential,
wherein said associated switch circuitry of each reference line couples that reference line to said reference potential when a read operation is performed on a memory cell of the associated column of memory cells,
said associated switch circuitry of each reference line decouples that reference line from said reference potential when a read operation is performed on a memory cell of said adjacent column of memory cells,
and the associated switch circuitry of the columns of memory cells connected to the shared bit line decouples those reference lines from said reference potential when the shared bit line is being pre-charged prior to said read operation.

2. The ROM array as claimed in claim 1, wherein connection of each reference line to said reference potential by said associated switch circuitry is determined by an associated column selection signal, wherein the column selection signal for a first column of memory cells and the column selection signal for a second column of memory cells cannot be simultaneously asserted if said first column of memory cells shares a bit line with said second column of memory cells.

3. The ROM array as claimed in claim 1, wherein each reference line has further associated switch circuitry arranged to selectively couple that reference line to an alternative potential different to said reference potential, each reference line being connected to said alternative potential by said further associated switch circuitry when that reference line is not connected to said reference potential.

4. The ROM array as claimed in claim 3, wherein connection of each reference line to said reference potential by said associated switch circuitry is determined by an associated column selection signal, wherein the column selection signal for a first column of memory cells and the column selection signal for a second column of memory cells cannot be simultaneously asserted if said first column of memory cells shares a bit line with said second column of memory cells, wherein said further associated switch circuitry couples its associated reference line to said alternative potential when said column selection signal is not asserted.

5. The ROM array as claimed in claim 1, wherein said reference line is a virtual ground line and said reference potential is a ground voltage level.

6. The ROM array as claimed in claim 3, wherein said reference line is a virtual ground line, said reference potential is a ground voltage level and said alternative potential is a supply voltage level.

7. The ROM array as claimed in claim 1, wherein at least one column of said plurality of columns of memory cells is a dummy column for self-timing of the read operation.

8. The ROM array as claimed in claim 7, wherein said dummy column generates a dummy read signal for said self-timing of the read operation.

9. The ROM array as claimed in claim 1, wherein pre-charging said shared bit line comprises connecting said shared bit line to a pre-charging potential dependent on a pre-charge signal.

10. The ROM array as claimed in claim 1, wherein a data value readout from said shared bit line is stored in a latch circuit.

11. The ROM array as claimed in claim 10, wherein a plurality of shared bit lines share said latch circuit, each of said plurality of shared bit lines being coupled to said latch circuit by shared bit line switch circuitry in dependence on a shared bit line selection signal.

12. A ROM array comprising:
a plurality of columns of memory cells;
each column of memory cells for coupling to a shared bit line, said shared bit line being shared by that column of memory cells with an adjacent column of memory cells;
each column of memory cells being connected to its own associated reference line; and
each reference line having associated switch means for selectively coupling that reference line to a reference potential,
wherein said associated switch means of each reference line couples that reference line to said reference potential when a read operation is performed on a memory cell of the associated column of memory cells,
said associated switch means of each reference line decouples that reference line from said reference potential when a read operation is performed on a memory cell of said adjacent column of memory cells, and the associated switch means of each reference line associated with the columns of memory cells connected to the shared bit line decouples those reference lines from said reference potential when the shared bit line is being pre-charged prior to said read operation.

13. A method of operating a ROM array, said ROM array comprising:

a plurality of columns of memory cells;

each column of memory cells being coupled to a shared bit line, said shared bit line being shared by that column of memory cells with an adjacent column of memory cells; and each column of memory cells being connected to its own associated reference line, said method comprising the steps of:

selecting a memory cell to read in a selected column of memory cells;

decoupling the reference line associated with the selected column of memory cells from the reference potential and decoupling the reference line associated with the adjacent column of memory cells from the reference potential;

pre-charging the shared bit line;

coupling the reference line associated with the selected column of memory cells to the reference potential; and performing a read operation on the selected memory cell.

* * * * *